United States Patent [19]

Shinozaki et al.

[11] 4,313,255

[45] Feb. 2, 1982

[54] METHOD FOR MANUFACTURING INTEGRATED CIRCUIT DEVICE

[75] Inventors: Satoshi Shinozaki; Shinzi Saito, both of Yokohama, Japan

[73] Assignee: VLSI Technology Research Association, Japan

[21] Appl. No.: 105,937

[22] Filed: Dec. 21, 1979

[30] Foreign Application Priority Data

Dec. 23, 1978 [JP]   Japan ............................... 53-160345

[51] Int. Cl.³ .................... H01L 21/425; H01L 21/74
[52] U.S. Cl. ..................................... 29/576 B; 29/589; 148/1.5; 148/190
[58] Field of Search ............... 148/1.5, 190; 29/576 B, 29/589; 357/91, 34

[56] References Cited

U.S. PATENT DOCUMENTS

| | | | |
|---|---|---|---|
| 3,523,042 | 8/1970 | Bower et al. | 148/1.5 |
| 3,798,084 | 3/1974 | Lyons | 148/189 |
| 4,063,967 | 12/1977 | Graul | 148/1.5 |

*Primary Examiner*—Aaron Weisstuch
*Attorney, Agent, or Firm*—Finnegan, Henderson, Farabow, Garrett & Dunner

[57] ABSTRACT

Disclosed is a method for manufacturing an integrated circuit device which comprises the steps of preparing a silicon substrate having an isolated first region of a first conductivity type, selectively forming on the first region a polycrystalline silicon layer containing an impurity of the first conductivity type, implanting the first region including the polycrystalline silicon layer with an ion of an impurity of a second conductivity type having higher diffusion coefficient than that of the impurity of the first conductivity type, and heating the substrate, whereby the implanted impurity of the second conductivity type is diffused into the first region to form a second region of the second conductivity type and the impurity of the first conductivity type in the polycrystalline silicon layer is diffused into the second region to form a third region of the first conductivity type.

7 Claims, 3 Drawing Figures

METHOD FOR MANUFACTURING INTEGRATED CIRCUIT DEVICE

BACKGROUND OF THE INVENTION

This invention relates to a method for manufacturing an integrated circuit (IC) device and more specifically an IC device including an isolated bipolar transistor.

Recently there have been developed semiconductor integrated circuits which enjoy increasingly improved capability of high-speed operation and large scale integration along with the advances in the processing techniques. Essential processes related to the improvement in the operating speed of semiconductor IC's are processes for miniaturization and oxide film isolation which affect reductions in parasitic capacitance and parasitic resistance. In a bipolar transistor, for example, emitter-base junction capacitance, base-collector junction capacitance, collector-substrate junction capacitance, collector series resistance, and base resistance are primary factors which determine the switching speed. High-speed operation necessitates reductions in these factors. Moreover, since the techniques needed for achievement of high-speed operation and large scale integration tend to be complicated, generally requiring an increased number of manufacturing processes, it is important in the aspects of mass production and cost to simplify these individual processes.

A borsenic process utilizing simultaneous diffusion of boron and arsenic ("borsenic") from a doped oxide source is disclosed in *IEEE Journal of Solid-State Circuits*, Vol. SC-11, No. 4, August, 1976, pp. 495–499. Fabrication of an isolated bipolar transistor in accordance with this borsenic process is advantageous to the simplification of processes and improvement in performance. However, since an $SiO_2$ layer doped with $As_2O_3$ and $B_2O_3$ is used as an impurity source for the formation of emitter and internal base regions, it is necessary that, in forming an emitter contact hole by selectively removing the doped $SiO_2$ layer, a margin with a fixed width for mask alignment be secured around the contact hole. As a result, it becomes difficult to reduce the emitter size. Further, it a PN-junction between the emitter and base is in contact with an oxide island for isolation, the sides of the oxide island will be etched to an unusual degree to expose the PN-junction during the etching step for forming the emitter contact hole, thereby causing a short circuit between the emitter and base. In forming the $SiO_2$ layer containing $As_2O_3$ and $B_2O_3$, $SiO_2$ is doped simultaneously with both these impurities. Accordingly, it is hard to control in a constant manner the concentrations of these two types of impurities in $SiO_2$ between lots. Therefore, the depths of the internal base and emitter regions will possibly lack in uniformity.

SUMMARY OF THE INVENTION

The object of this invention is to provide a method for manufacturing a high-performance IC device eliminating the above-mentioned drawbacks of the borsenic process and ensuring high reproducibility with use of a reduced number of manufacturing processes.

According to this invention, there is provided a method for manufacturing an integrated circuit device which comprises the steps of preparing a semiconductor substrate having an isolated first region of a first conductivity type, selectively forming on the first region a polycrystalline silicon layer (hereinafter referred to simply as "poly-Si layer") containing an impurity of the first conductivity type, implanting the first region including the poly-Si layer with an ion of an impurity of a second conductivity type having a higher diffusion coefficient than that of the impurity of the first conductivity type, and heating the substrate, whereby the implanted impurity of the second conductivity type is diffused into the first region to form a second region of the second conductivity type and the impurity of the first conductivity type in the poly-Si layer is diffused into the second region to form a third region of the first conductivity type.

If the aforementioned integrated circuit device includes a bipolar transistor, then the first, second and third regions may be collector, base and emitter regions, respectively.

Subsequent to the step of forming the poly-Si layer, a step for forming a silicon dioxide layer on the surface of the first region including the poly-Si layer may be employed for controlling the depths of the second and third regions. Preferably, the impurities of the first and second conductivity types are arsenic and boron, respectively.

DETAILED DESCRIPTION OF THE PREFERRED EMBODIMENT

Figure 1A:
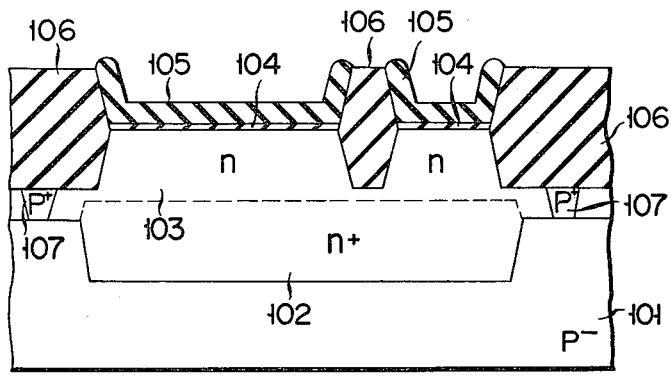
FIGS. 1A to 1F are sectional views illustrating the sequence of processes of method of this invention for manufacturing a bipolar transistor isolated by an oxide island.

Referring now to the drawings of FIGS. 1A to 1F, there will be described an embodiment of the method of this invention.

(I) First, as shown in FIG. 1A, an $n^+$-type buried layer 102 was formed in a P-type silicon substrate 101, and an n-type epitaxial layer 103 with a specific resistance of $\rho_{VG} \simeq 0.4$ $\Omega$-cm and a thickness of $t_{VG} \simeq 2.0$ $\mu$m was formed on the substrate 101. Subsequently, a thermal oxide film 104 of 300 Å thickness was formed on the epitaxial layer 103 by thermal oxidation, and a silicon nitride film 105 of 3000 Å thickness was formed on top of the thermal oxide film 104 by a CVD method. Then, respective portions of the silicon nitride film 105 and the thermal oxide film 104 corresponding to a region where a silicon island as mentioned later was to be formed were removed from the surface of the epitaxial layer 103 to form a silicon nitride film pattern. Thereafter, with a resist pattern used as a mask, boron ions were implanted in portions of the epitaxial layer 103 in which channel cut regions 107 as mentioned later were to be formed at a rate of $1 \times 10^{16}$ $cm^{-2}$ and a voltage of 300 KV. Then, the resultant structure was treated in a wet oxygen atmosphere at 1000° C. and 9 atm. for 70 minutes by using the silicon nitride film pattern as a mask. As a result, silicon dioxide islands 106 with a thickness of approximately 2 $\mu$m and the channel cut regions 107 were formed simultaneously.

Figure 1B:
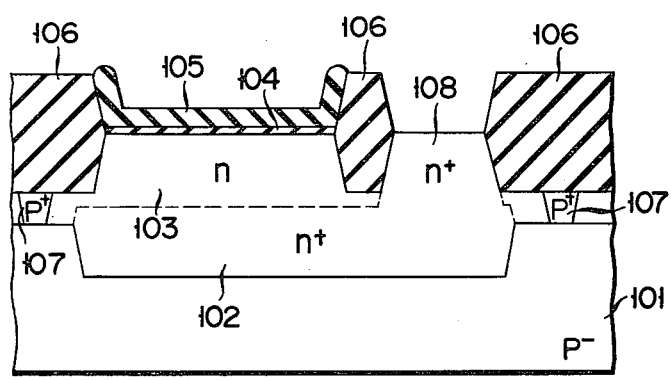

(II) Then, as shown in FIG. 1B, the silicon nitride film 105 and thermal oxide film 104 were selectively removed to exposed a portion of the n-type epitaxial layer 103, and thereafter exposed to phosphorus oxychloride gas at 1000 C. Thus, high-concentration phosphorus was diffused into the exposed portion of the epitaxial layer 103 to form an n+-type diffusion layer as a collector region 108 as mentioned later. Extending to the n+-type buried layer 102, the n+-type diffusion layer was able to restrain the increase in the series resistance of the collector. Since a region where base and emitter as mentioned later are to be formed is masked with the silicon nitride film 105 and thermal oxide film 104, phosphorus is prevented from being diffused into such region.

Figure 1C:
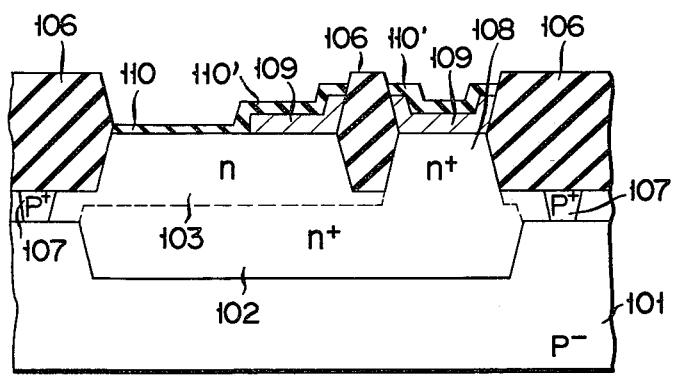

(III) Then, as shown in FIG. 1C, the silicon nitride film 105 and thermal oxide film 104 were removed, and a polycrystalline silicon film (poly-Si film) 109 containing arsenic at $5 \times 10^{20} cm^{-3}$ was formed by a CVD method. Further, using a resist pattern as a mask, the poly-Si film 109 was etched with an etchant mixture solution, $HF + HNO_3 + CH_3COOH + I_2$, and left on the surfaces of the epitaxial layer and n+-type diffusion layer 108 to serve as emitter and collector regions as mentioned later. Subsequently, the poly-Si film 109 was oxidized in a wet oxygen atmosphere for 25 minutes at such a low temperature (900° C.) that arsenic contained in the film 109 can hardly be diffused into the silicon body. In consequence, an $SiO_2$ film 110 of 700 Å thickness and an $SiO_2$ film 110' of 3000 Å thickness were formed on the surfaces of the exposed n-type epitaxial layer 103 and the poly-Si film 109, respectively.

Figure 1D:
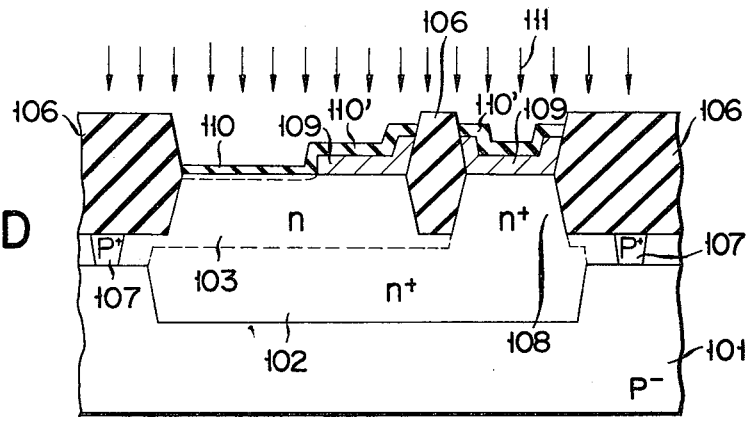
Figure 1E:
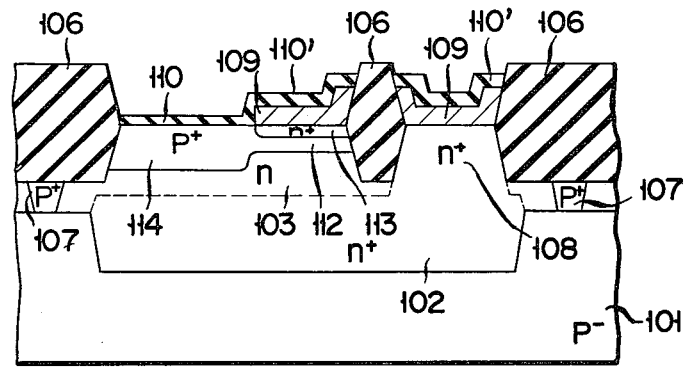

(IV) Then, boron ions 111 of 170 keV were implanted at a rate of $1 \times 10^{15} cm^{-2}$ over the whole surface, as shown in FIG. 1D. At this time, the peak position of boron ion distribution was approximately 4600 Å away from the surface of the $SiO_2$ film 110. Subsequently, the resultant structure was heated in a nitrogen atmosphere at 1000° C. for approximately 20 minutes. The diffusion coefficient of arsenic in the poly-Si film 109 is approximately $1.1 \times 10^{-13} cm^2/sec.$ at 1000° C., whereas the diffusion coefficient of boron in the same film 109 is approximately $1 \times 10^{-12} cm^2/sec.$ Consequently, the distribution of boron outstripped that of arsenic in the region right under the poly-Si film 109 to form an internal base region 112, and thereafter an emitter region 113 was formed on the internal base region 112 (FIG. 1E). Moreover, boron implanted in the $SiO_2$ film 110 and the superficial portion of the epitaxial layer 103 thereunder was diffused by the heat treatment to form an external base region 114, as shown in FIG. 1E. The diffusion depths of the emitter region 113, internal base region 112 and external base region 114 were $X_{jE} = 0.3$ μm, $X_{jB} = 0.5$ μm and $X_{jB'} = 0.85$ μm, respectively.

Figure 1F:
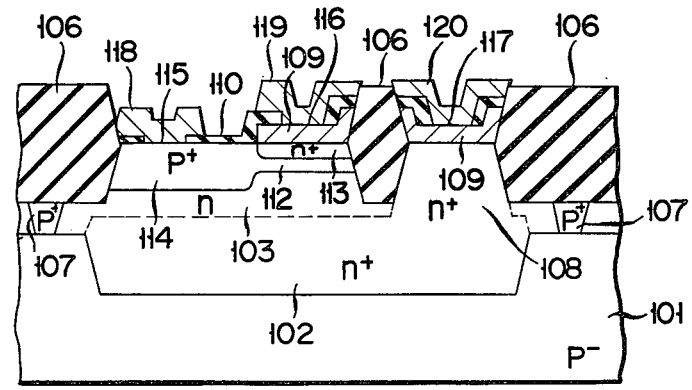

(V) Thereafter, a base contact hole 115, an emitter contact hole 116, and a collector contact hole 117 were opened in the oxide film 110 on the base region 114, the oxide film 110' over the emitter region 113, and the oxide film 110' over the collector region 108, respectively, and then aluminum electrodes 118, 119 and 120 were separately formed to complete a bipolar transistor (FIG. 1F).

The method of this invention, as described above, has the following advantages over the prior art borsenic process.

(1) According to this invention, the impurities for the formation of the internal and external base regions 112 and 114 are supplied by a single boron ion implantation. In the borsenic process, on the other hand, the impurity for the internal base is supplied from an $SiO_2$ layer containing $As_2O_3$ and $B_2O_3$, and the supply of the impurity for the external base requires separate boron predeposition. That is, the method of the invention can be done with a reduced number of manufacturing steps as compared with the case of the borsenic process.

(2) Since the borsenic process uses as an impurity source glass doped simultaneously with the two types of impurities, as aforesaid, it is hard to control the impurity concentrations between lots. This invention does not, however, employ such an impurity source. According to the invention, although arsenic and boron are separately doped into the poly-Si layer 109, concentration control of these impurities is easy, so that the depths of the internal base and emitter regions can be made uniform.

(3) According to this invention, the poly-Si layer 109 doped with arsenic may serve as a conductor to connect the emitter electrode to the emitter region, as well as the diffusion source for the formation of the emitter, so that reduction in the emitter area is facilitated. With the borsenic process, on the other hand, part of the $SiO_2$ layer containing arsenic and boron needs to be removed in forming the opening for emitter contact, making the reduction in the emitter area difficult.

(4) According to the invention, the $SiO_2$ film 110 is selectively removed by etching before the steps of forming the emitter electrode 119, as shown in FIGS. 1E and 1F. In this etching process, however, it is not feared that the silicon dioxide island 106 will be etched to such a degree as to expose the PN-junction between the emitter and base. This is attributable to the existence of the poly-Si layer 109. On the other hand, the borsenic process, which does not enjoy the existence of the poly-Si layer 109, is threatened with extraordinary etching.

Figure 2:
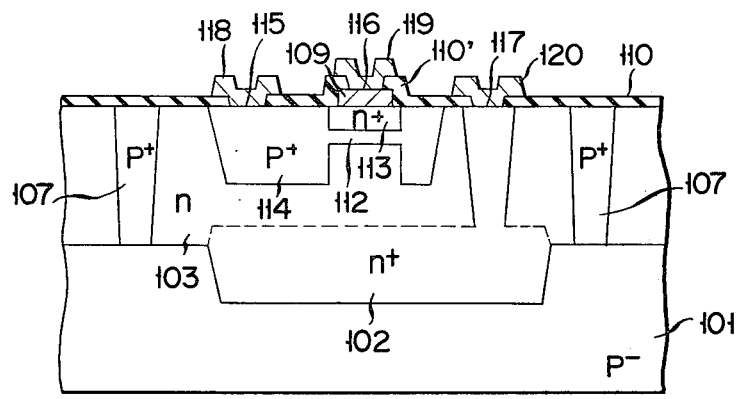
FIG. 2 is a sectional view of an example of a bipolar transistor isolated by a PN-junction to which the manufacturing method of the invention is applied.
Figure 3:
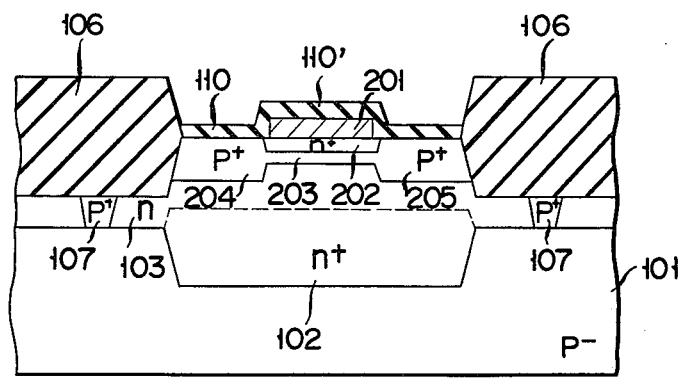
FIG. 3 is a sectional view of an example of a junction-type field-effect transistor or pinch-off resistor to which the manufacturing method of the invention is applied.

The method of this invention is not limited to the manufacture of the bipolar transistor in which isolation is achieved by means of the oxide islands 106, as described in connection with the above embodiment. For example, as shown in FIG. 2 there may be manufactured a bipolar transistor employing PN-junction isolation in which element regions are isolated by p+ channel cut regions 107. In FIG. 2, like reference numerals refer to the same parts as shown in FIG. 1F. Moreover, the method of the invention may be applied also to the manufacture of a junction FET (JFET) as shown in FIG. 3. Also in FIG. 3, like reference numerals refer to the same parts of FIG. 1F. Numeral 201 designates a poly-Si film doped with arsenic and boron (this boron is added by ion implantation), while numeral 202 denotes an n+ diffusion layer formed by diffusion of arsenic. Furthermore, numeral 203 designates a p-type channel region layer formed by diffusion of boron from the poly-Si layer 201, and numerals 204 and 205 designate p+ source and p+ drain regions formed by diffusion of boron implanted through the $SiO_2$ film 110. Supply of all the impurities for the formation of the p-type channel region 203 and p+ source and p+ drain regions 204 and 205 can be achieved by a single boron implantation. The structure of FIG. 3 may also used as a p-type pinch-off resistor without changing its arrangement at all. In this case, the region 203 serves as the pinch-off resistance, and the regions 204 and 205 correspond to p+ contact regions. Such construction enables design of a large resistor with use of a very small area.

What we claim is:

1. A method for manufacturing an integrated device comprising the steps of preparing a semiconductor substrate having an isolated region of a first conductivity type;

forming on a selected portion of said isolated region a polycrystalline silicon layer containing a dopant impurity of said first conductivity type;

forming a silicon dioxide layer over the isolated region, including said doped polycrystalline silicon layer, subjecting the isolated region, including the silicon dioxide layer and the doped polycrystalline silicon layer, to an ion implantation of an impurity of a second conductivity type having a higher diffusion coefficient than that of the impurity of said first conductivity type, to thereby implant an impurity of said second conductivity type into said layers;

heating said substrate and said layers for a sufficient period to diffuse the impurities of the first and second types to said substrate, whereby the impurity of the first type diffuses into the substrate below the polycrystalline silicon layer to form a first region of first conductivity type, the ion-implanted impurity of the second type diffuses into the substrate below the polycrystalline silicon layer and beyond said first region to form a second region of second conductivity type, and the ion impurity of the second type implanted in the silicon dioxide layer diffuses into the substrate below said silicon dioxide layer to form a third region of second conductivity type.

2. The method according to claim 1 wherein said impurities of said first and second conductivity types are arsenic and boron, respectively, and wherein said first region is an emitter region, said second region is an interior base region, and said third region is an exterior base region.

3. The method according to claim 1 wherein said silicon dioxide layer formed over said polycrystalline silicon layer is thicker than the silicon dioxide layer formed directly on the substrate.

4. The method according to claim 3 wherein said substrate is a silicon substrate.

5. A method for manufacturing an integrated circuit device with a bipolar transistor comprising:

preparing a silicon substrate having an isolated region of a first conductivity type;

forming on a selected portion of said isolated region a polycrystalline silicon layer containing a dopant impurity of said first conductivity type;

forming a silicon dioxide layer over the isolated region, including said doped polycrystalline silicon layer, for controlling the formation of the emitter and base regions of the bipolar transistor;

subjecting the isolated region, including the silicon dioxide layer and the doped polycrystalline silicon layer, to an ion implantation of an impurity of a second conductivity type having a higher diffusion coefficient than that of the impurity of said first conductivity type, to thereby implant an impurity of said second conductivity type into said layers;

heating said substrate and said layers for a sufficient period to diffuse the impurities of the first and second types into said substrate, whereby the impurity of the first type diffuses into the substrate below the polycrystalline silicon layer to form a first region of first conductivity type, the ion-implanted impurity of the second type diffuses into the silicon substrate below the polycrystalline silicon layer and beyond said first region to form a second region of second conductivity type, and the ion impurity of the second type implanted in the silicon dioxide layer diffuses into the substrate below said silicon dioxide layer to form a third region of second conductivity type.

6. The method according to claim 5 wherein said impurities of said first and second conductivity types are arsenic and boron, respectively, and wherein said first region is an emitter region, said second region is an interior base region, and said third region is an exterior base region.

7. The method according to claim 6 further comprising the steps of:

selectively removing a portion of the silicon dioxide layer directly over said polycrystalline silicon layer to form a first contact hole;

removing a portion of the silicon dioxide layer directly over said isolated region of said substrate to form a second contact hole; and attaching electrodes at said first and second contact holes directly to said polycrystalline silicon layer and said silicon substrate, respectively, whereby said polycrystalline layer acts as a conductor connecting the emitter electrode and the emitter region.

* * * * *